(12) United States Patent
Kim

(10) Patent No.: US 12,513,886 B2
(45) Date of Patent: Dec. 30, 2025

(54) SEMICONDUCTOR DEVICE AND METHOD FOR FABRICATING THE SAME

(71) Applicant: SK hynix Inc., Gyeonggi-do (KR)

(72) Inventor: Seung Hwan Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 540 days.

(21) Appl. No.: 17/844,537

(22) Filed: Jun. 20, 2022

(65) Prior Publication Data

US 2023/0217644 A1  Jul. 6, 2023

(30) Foreign Application Priority Data

Dec. 30, 2021  (KR) .......................... 10-2021-0193048

(51) Int. Cl.
*H10B 12/00* (2023.01)

(52) U.S. Cl.
CPC .................................. *H10B 12/30* (2023.02)

(58) Field of Classification Search
CPC ............................. H10B 12/30; H10B 12/488
See application file for complete search history.

(56) References Cited

U.S. PATENT DOCUMENTS

2020/0411523 A1  12/2020  Shin et al.
2022/0093532 A1*  3/2022  Lee .......................... H10B 12/30

FOREIGN PATENT DOCUMENTS

KR  10-2020-0105216 A  9/2020
KR  10-2021-0077098 A  6/2021

OTHER PUBLICATIONS

Office Action for Korean Patent Application No. 10-2021-0193048 issued by the Korean Patent Office on Jul. 18, 2025.

* cited by examiner

*Primary Examiner* — Daniel P Shook
(74) *Attorney, Agent, or Firm* — IP & T GROUP LLP

(57) ABSTRACT

A semiconductor device may include a word line stack over a substrate; a plurality of supporters including vertically extending blocking spacers to support the word line stack; and storage nodes of a capacitor disposed laterally between the supporters.

20 Claims, 14 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2021-0193048, filed on Dec. 30, 2021, which is incorporated herein by reference in its entirety.

BACKGROUND

1. Field

Various embodiments of the present invention relate to a semiconductor device, and more particularly, to a semiconductor device having a three-dimensional structure and a method for fabricating the same.

2. Description of the Related Art

In order to increase the net die of a memory device, the size of a memory cell is being reduced continuously. As the size of the memory cell is being miniaturized, the parasitic capacitance (Cb) needs to be reduced and the capacitance needs to be increased. However, it is difficult to increase the net die due to the structural limitation of memory cells.

Recently, three-dimensional semiconductor devices including memory cells that are arranged in three dimensions are being suggested.

SUMMARY

Embodiments of the present invention are directed to a semiconductor device including highly integrated memory cells, and a method for fabricating the semiconductor device.

In accordance with an embodiment of the present invention, a semiconductor device may include a word line stack over a substrate; a plurality of supporters including vertically extending blocking spacers to support the word line stack; and storage nodes of a capacitor disposed laterally between the supporters.

In accordance with another embodiment of the present invention, a semiconductor device may include active layers vertically stacked over a substrate; word lines extending in a direction crossing the active layers over the active layers; a bit line commonly coupled to one side of each of the active layers and extending in a direction perpendicular to the substrate; storage nodes of a capacitor that are vertically stacked over the substrate while being coupled to another side of each of the active layers; and a plurality of supporters including a vertically extending blocking spacer to support the storage nodes.

In accordance with another embodiment of the present invention, a semiconductor device may include a plurality of stack structures over a substrate; a plurality of vertical isolation layers including vertical blocking spacers to support the stack structures; and wherein the vertical blocking spacers are formed of carbon-containing material.

In accordance with yet another embodiment of the present invention, a method for fabricating a semiconductor device may include forming an alternating stack including a first dielectric layer, a first sacrificial layer, a semiconductor layer, a second sacrificial layer, and a second dielectric layer over a substrate; forming a plurality of openings by etching the alternating stack; and forming a plurality of supporters including a blocking spacer which vertically extends while filling the openings.

The method may further include after the forming of the supporters: replacing the first and second sacrificial layers of the alternating stack with word lines; forming a vertically oriented bit line in contact with one side of the semiconductor layers; and forming a capacitor including a storage node which is coupled to another side of each of the active layers while being disposed laterally between the supporters.

The forming of the supporters may include forming a liner layer in each of the openings; forming a blocking spacer over the liner layer; and forming a gap-fill layer filling the openings over the blocking spacer. The liner layer and the gap-fill layer may include silicon oxide, and the blocking spacer includes silicon carbon oxide.

These and other features and advantages of the present invention will become more apparent to the person with ordinary skill in the art of the present invention from the detailed description of various embodiments of the present invention in conjunction with the following drawings.

DETAILED DESCRIPTION

Figure 1:
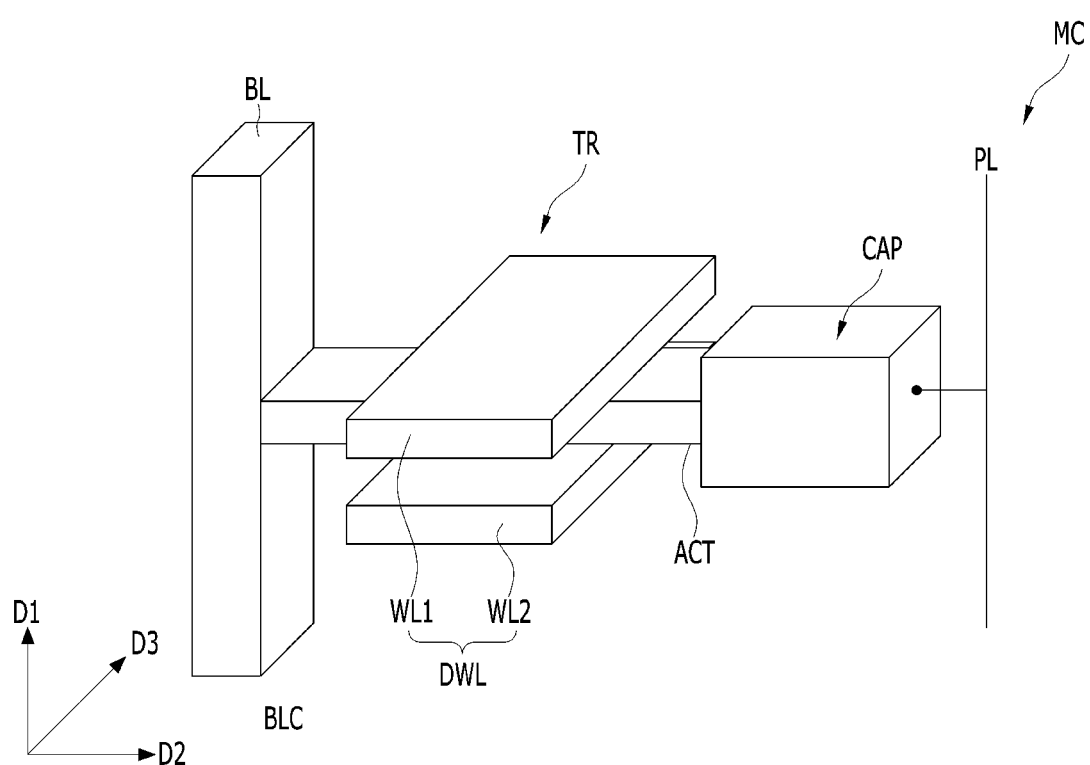
FIG. 1 is a schematic perspective view illustrating a memory cell of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

According to the following embodiments of the present invention, memory cell density may be increased and parasitic capacitance may be reduced by vertically stacking memory cells.

Figure 2:
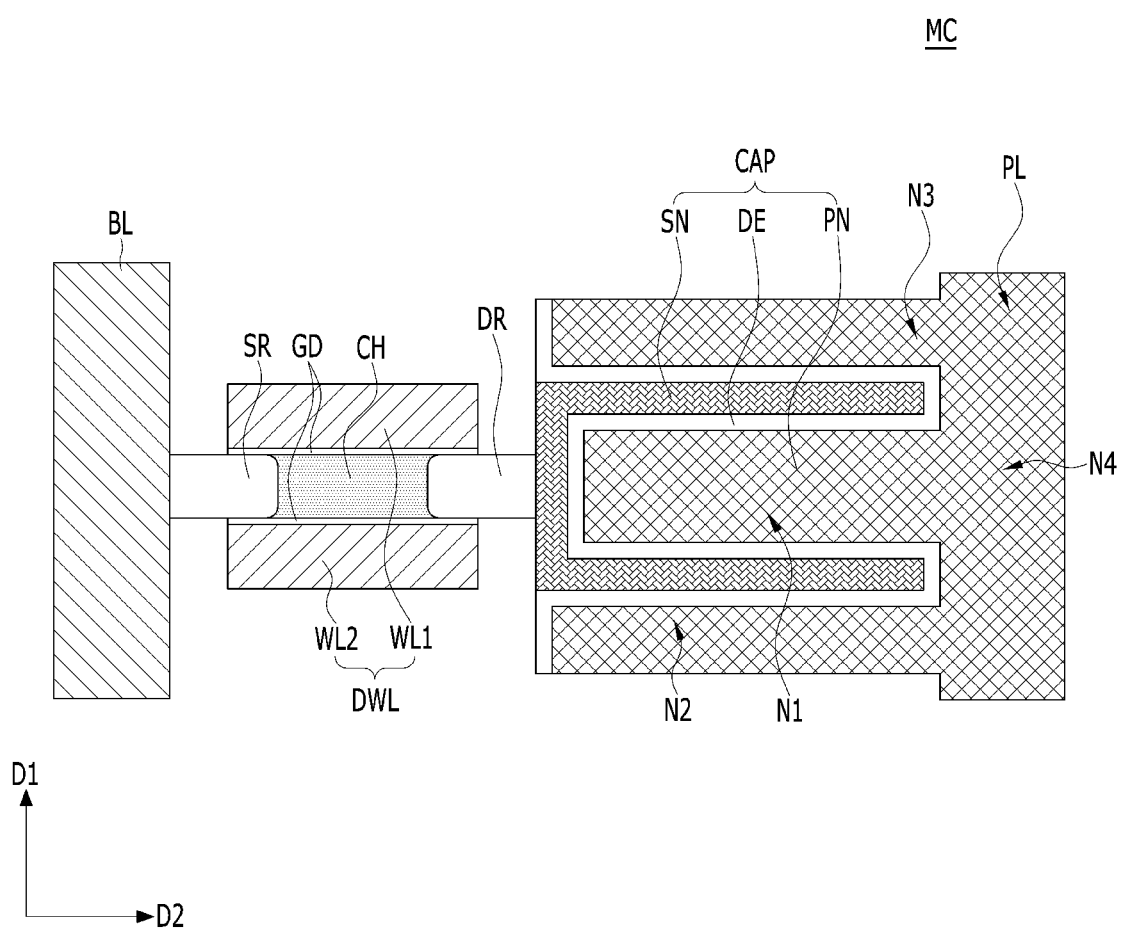
FIG. 2 is a cross-sectional view illustrating the memory cell shown in FIG. 1.

FIG. 1 is a schematic perspective view illustrating a memory cell of a semiconductor device in accordance with an embodiment of the present invention. FIG. 2 is a cross-sectional view illustrating the memory cell shown in FIG. 1.

Referring to FIGS. 1 and 2, a memory cell MC of a 3D semiconductor device according to the embodiments of the present invention may include a bit line BL, a transistor TR, and a capacitor CAP. The transistor TR may include an active layer ACT and a double word line DWL, where the double word line DWL includes a first word line WL1 and a second word line WL2 that are opposite to each other with the active layer ACT interposed therebetween. The capacitor CAP may include a storage node SN, a plate node PN, and a dielectric layer DE disposed between the storage node SN and the plate node PN.

The bit line BL may have a pillar shape extending in a first direction D1. The active layer ACT may have a bar shape extending in a second direction D2 intersecting with the first direction D1. The double word line DWL may have a line shape extending in a third direction D3 intersecting with the first and second directions D1 and D2. The plate node PN of the capacitor CAP may be coupled to a plate line PL.

The bit line BL may be vertically oriented in the first direction D1. The bit line BL may be referred to as a vertically oriented bit line or a pillar-type bit line. The bit line BL may include a conductive material. The bit line BL may include a silicon-based material, a metal-based material, or a combination thereof. The bit line BL may include silicon, a metal, a metal nitride, a metal silicide, or a combination thereof. The bit line BL may include polysilicon, titanium nitride, tungsten, or a combination thereof. For example, the bit line BL may include polysilicon or titanium nitride (TiN) which is doped with an N-type impurity. The bit line BL may include a TiN/W stack including titanium nitride and tungsten over titanium nitride.

The double word line DWL may extend long in the third direction D3, and the active layer ACT may extend in the second direction D2. The active layer ACT may be laterally arranged in the second direction D2 from the bit line BL. The double word line DWL may include a pair of word lines, which includes a first word line WL1 and a second word line WL2. The first word line WL1 and the second word line WL2 may face each other in the first direction D1 with the active layer ACT interposed therebetween. A gate dielectric layer GD may be formed over the upper and lower surfaces of the active layer ACT.

The active layer ACT may include a semiconductor material or an oxide semiconductor material. For example, the active layer ACT may include monocrystalline silicon, germanium, silicon-germanium, or indium gallium zinc oxide (IGZO). The active layer ACT may include polysilicon or monocrystalline silicon. The active layer ACT may include a channel CH, a first source/drain region SR between the channel CH and the bit line BL, and a second source/drain region DR between the channel CH and the capacitor CAP. The channel CH may be defined between the first source/drain region SR and the second source/drain region DR.

The first source/drain region SR and the second source/drain region DR may be doped with impurities of the same conductivity type. The first source/drain region SR and the second source/drain region DR may be doped with an N-type impurity or a P-type impurity. The first source/drain region SR and the second source/drain region DR may include at least one impurity selected among arsenic (As), phosphorus (P), boron (B), indium (In), and a combination thereof. A first side of the first source/drain region SR may be in contact with the bit line BL, and a second side of the first source/drain region SR may be coupled to the channel CH. A first side of the second source/drain region DR may be in contact with a storage node SN, and a second side of the second source/drain region DR may be in contact with the channel CH. The second side of the first source/drain region SR and the second side of the second source/drain region DR may partially overlap with the sides of the first and second word lines WL1 and WL2, respectively. The lateral length of the channel CH in the second direction D2 may be smaller than the lateral lengths of the first and second source/drain regions SR and DR in the second direction D2. According to another embodiment of the present invention, the lateral length of the channel CH in the second direction D2 may be greater than the lateral lengths of the first and second source/drain regions SR and DR in the second direction D2.

The transistor TR may be a cell transistor and it may have a double word line DWL. In the double word line DWL, the first word line WL1 and the second word line WL2 may have the same potential. For example, the first word line WL1 and the second word line WL2 may form a pair, and the same word line driving voltage may be applied to the first word line WL1 and the second word line WL2. As such, the memory cell MC according to the embodiment of the present invention may have a double word line DWL in which two first and second word lines WL1 and WL2 are disposed adjacent to one channel CH.

According to another embodiment of the present invention, the first word line WL1 and the second word line WL2 may have different potentials. For example, a word line driving voltage may be applied to the first word line WL1, and a ground voltage may be applied to the second word line WL2. The second word line WL2 may be referred to as a back word line or a shield word line. According to another embodiment of the present invention, the ground voltage may be applied to the first word line WL1, and the word line driving voltage may be applied to the second word line WL2.

The active layer ACT may have a thickness which is smaller than those of the first and second word lines WL1 and WL2. In other words, the vertical thickness of the active layer ACT in the first direction D1 may be smaller than the vertical thickness of each of the first and second word lines WL1 and WL2 in the first direction D1. The thin active layer ACT may be referred to as a thin-body active layer. The thin active layer ACT may include a thin-body channel CH, and the thin-body channel CH may have a thickness of approximately 10 nm or less. According to another embodiment of the present invention, the channel CH may have the same vertical thickness as those of the first and second word lines WL1 and WL2.

The gate dielectric layer GD may include silicon oxide, silicon nitride, a metal oxide, a metal oxynitride, a metal silicate, a high-k material, a ferroelectric material, an anti-ferroelectric material or a combination thereof. The gate dielectric layer GD may include $SiO_2$, $Si_3N_4$, $HfO_2$, $Al_2O_3$, $ZrO_2$, AlON, HfON, HfSiO, HfSiON, or HfZrO.

The double word line DWL may include a metal, a metal mixture, a metal alloy, or a semiconductor material. The double word line DWL may include titanium nitride, tungsten, polysilicon, or a combination thereof. For example, the double word line DWL may include a TiN/W stack in which titanium nitride and tungsten are sequentially stacked. The double word line DWL may include an N-type work function material or a P-type work function material. The N-type work function material may have a low work function of approximately 4.5 eV or less, and the P-type work function material may have a high work function of approximately 4.5 eV or more.

The capacitor CAP may be laterally disposed in the second direction D2 from the transistor TR. The capacitor CAP may include a storage node SN laterally extending from the active layer ACT in the second direction D2. The capacitor CAP may further include a dielectric layer DE and a plate node PN over the storage node SN. The storage node SN, the dielectric layer DE, and the plate node PN may be laterally arranged in the second direction D2. The storage node SN may have a laterally oriented cylinder-shape. The dielectric layer DE may conformally cover the cylindrical inner wall and the cylindrical outer wall of the storage node SN. The plate node PN may have a shape extending to the cylindrical inner wall and the cylindrical outer wall of the storage node SN over the dielectric layer DE. The plate node PN may be coupled to the plate line PL. The storage node SN may be electrically connected to the second source/drain region DR.

The storage node SN may have a three-dimensional structure. The storage node SN may have a lateral three-dimensional structure which is oriented in the second direction D2. As an example of the three-dimensional structure, the storage node SN may have a cylinder shape. According to another embodiment of the present invention, the storage node SN may have a pillar shape or a pylinder shape. The pylinder shape may refer to a structure in which a pillar shape and a cylinder shape are merged.

The plate node PN may include an internal node N1 and external nodes N2, N3 and N4. The internal node N1 and the external nodes N2, N3 and N4 may be coupled to each other. The internal node N1 may be disposed inside the cylindrical structure of the storage node SN. The external nodes N2 and N3 may be disposed in the outside of the storage node SN with the dielectric layer DE interposed therebetween. The external node N4 may couple the internal node N1 with each of the external nodes N2 and N3. The external nodes N2 and N3 may be disposed to surround the cylindrical outer wall of the storage node SN. The external node N4 may serve as a plate line PL.

The storage node SN and the plate node PN may include a metal, a noble metal, a metal nitride, a conductive metal oxide, a conductive noble metal oxide, a metal carbide, a metal silicide, or a combination thereof. For example, the storage node SN and the plate node PN may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a titanium nitride/tungsten (TiN/W) stack, or a tungsten nitride/tungsten (WN/W) stack. The plate node PN may include a combination of a metal-based material and a silicon-based material. For example, the plate node PN may be a stack of titanium nitride/silicon germanium/tungsten nitride (TiN/SiGe/WN). In the titanium nitride/silicon germanium/tungsten nitride (TiN/SiGe/WN) stack, silicon germanium may be a gap-fill material filling the cylindrical inside of the storage node SN over the titanium nitride, and titanium nitride (TiN) may serve as a plate node PN of the capacitor CAP, and tungsten nitride may be a low-resistance material.

The dielectric layer DE may include silicon oxide, silicon nitride, a high-k material, or a combination thereof. The high-k material may have a higher dielectric constant than silicon oxide. Silicon oxide ($SiO_2$) may have a dielectric constant of approximately 3.9, and the dielectric layer DE may include a high-k material having a dielectric constant of approximately 4 or more. The high-k material may have a dielectric constant of approximately 20 or more. The high-k material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$) or strontium titanium oxide ($SrTiO_3$). According to another embodiment of the present invention, the dielectric layer DE may be formed of a composite layer including two or more layers of the aforementioned high-k materials.

The dielectric layer DE may be formed of a zirconium-based oxide. The dielectric layer DE may have a stacked structure including at least zirconium oxide ($ZrO_2$). The stacked structure including zirconium oxide ($ZrO_2$) may include a ZA ($ZrO_2/Al_2O_3$) stack or a ZAZ ($ZrO_2/Al_2O_3/ZrO_2$) stack. The ZA stack may have a structure in which aluminum oxide ($Al_2O_3$) is stacked over zirconium oxide ($ZrO_2$). The ZAZ stack may have a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer ($ZrO_2$-based layer). According to another embodiment of the present invention, the dielectric layer DE may be formed of hafnium-based oxide (Hf-based oxide). The dielectric layer DE may have a stacked structure including at least hafnium oxide ($HfO_2$). The stacked structure including hafnium oxide ($HfO_2$) may include an HA ($HfO_2/Al_2O_3$) stack or an HAH ($HfO_2/Al_2O_3/HfO_2$) stack. The HA stack may have a structure in which aluminum oxide ($Al_2O_3$) is stacked over hafnium oxide ($HfO_2$). The HAH stack may have a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, ZAZ stack, HA stack, and HAH stack, aluminum oxide ($Al_2O_3$) may have a higher bandgap energy (which will be, hereinafter, simply referred to as bandgap) than zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Accordingly, the dielectric layer DE may include a stack of a high-k material and a high bandgap material having a larger bandgap than the high-k material. The dielectric layer DE may include silicon oxide ($SiO_2$) as a high bandgap material other than aluminum oxide ($Al_2O_3$). Since the dielectric layer DE includes a high bandgap material, leakage current may be suppressed. The high bandgap material may be thinner than the high-k material. According to another embodiment of the present invention, the dielectric layer DE may include a laminated structure in which a high-k material and a high bandgap material are alternately stacked. For example, it may include a ZAZA ($ZrO_2/Al_2O_3/ZrO_2/Al_2O_3$) stack, a ZAZAZ ($ZrO_2/Al_2O_3/ZrO_2/Al_2O_3/ZrO_2$) stack, a HAHA ($HfO_2/Al_2O_3/HfO_2/Al_2O_3$) stack, or a HAHAH ($HfO_2/Al_2O_3/HfO_2/Al_2O_3/$ HfO$_2$) stack. In the above laminated structure, aluminum oxide (Al$_2$O$_3$) may be thinner than zirconium oxide (ZrO$_2$) and hafnium oxide (HfO$_2$).

According to another embodiment of the present invention, the dielectric layer DE may include a stacked structure, a laminated structure, or a mixed structure including zirconium oxide, hafnium oxide and aluminum oxide.

According to another embodiment of the present invention, the dielectric layer DE may include a ferroelectric material or an antiferroelectric material.

According to another embodiment of the present invention, an interface control layer for improving leakage current may be further formed between the storage node SN and the dielectric layer DE. The interface control layer may include titanium oxide (TiO$_2$), niobium oxide (Nb$_2$O$_5$), or niobium nitride (NbN). The interface control layer may also be formed between the plate node PN and the dielectric layer DE.

The capacitor CAP may include a metal-insulator-metal (MIM) capacitor. The storage node SN and the plate node PN may include a metal-based material.

The capacitor CAP may be replaced with another data storage material. For example, the data storage material may be a phase change material, a magnetic tunnel junction (MTJ), or a variable resistance material.

Figure 3:
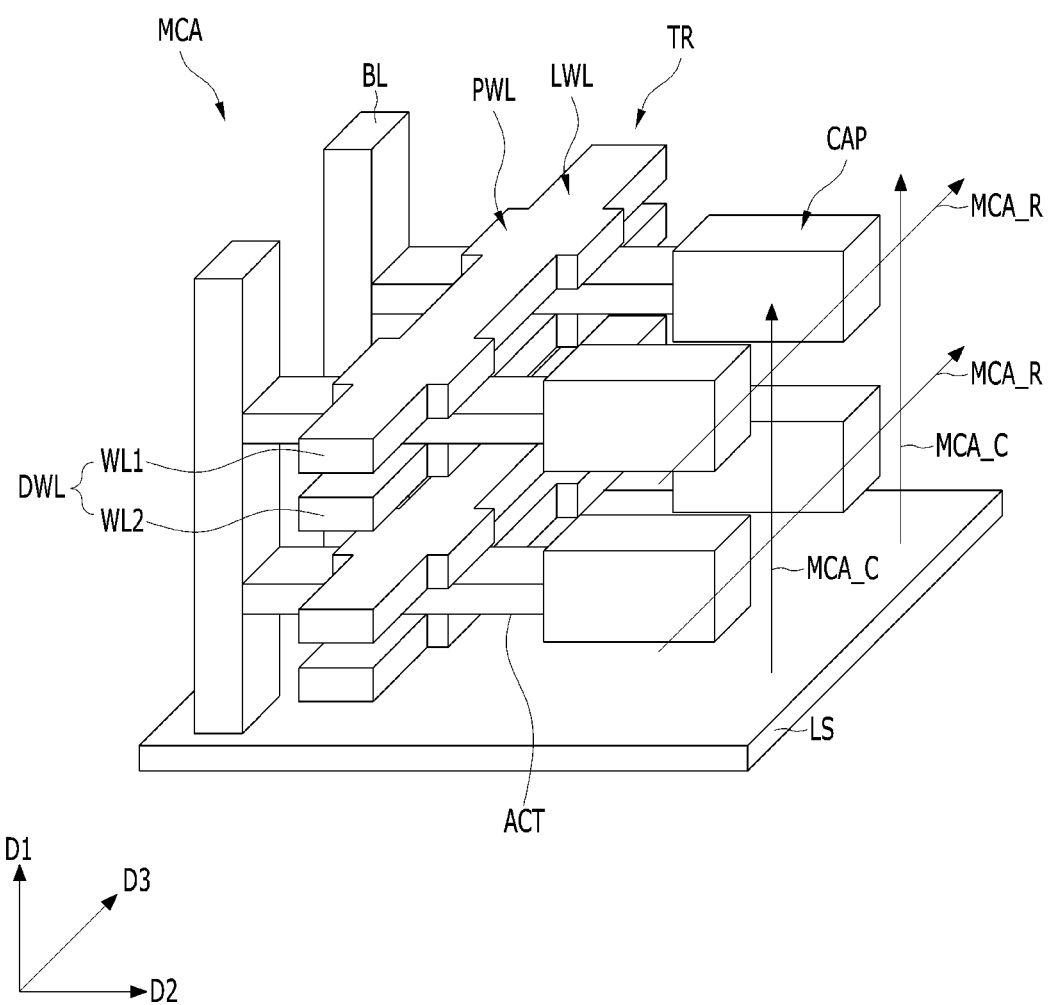
FIG. 3 is a schematic perspective view illustrating a semiconductor device in accordance with an embodiment of the present invention.
Figure 4:
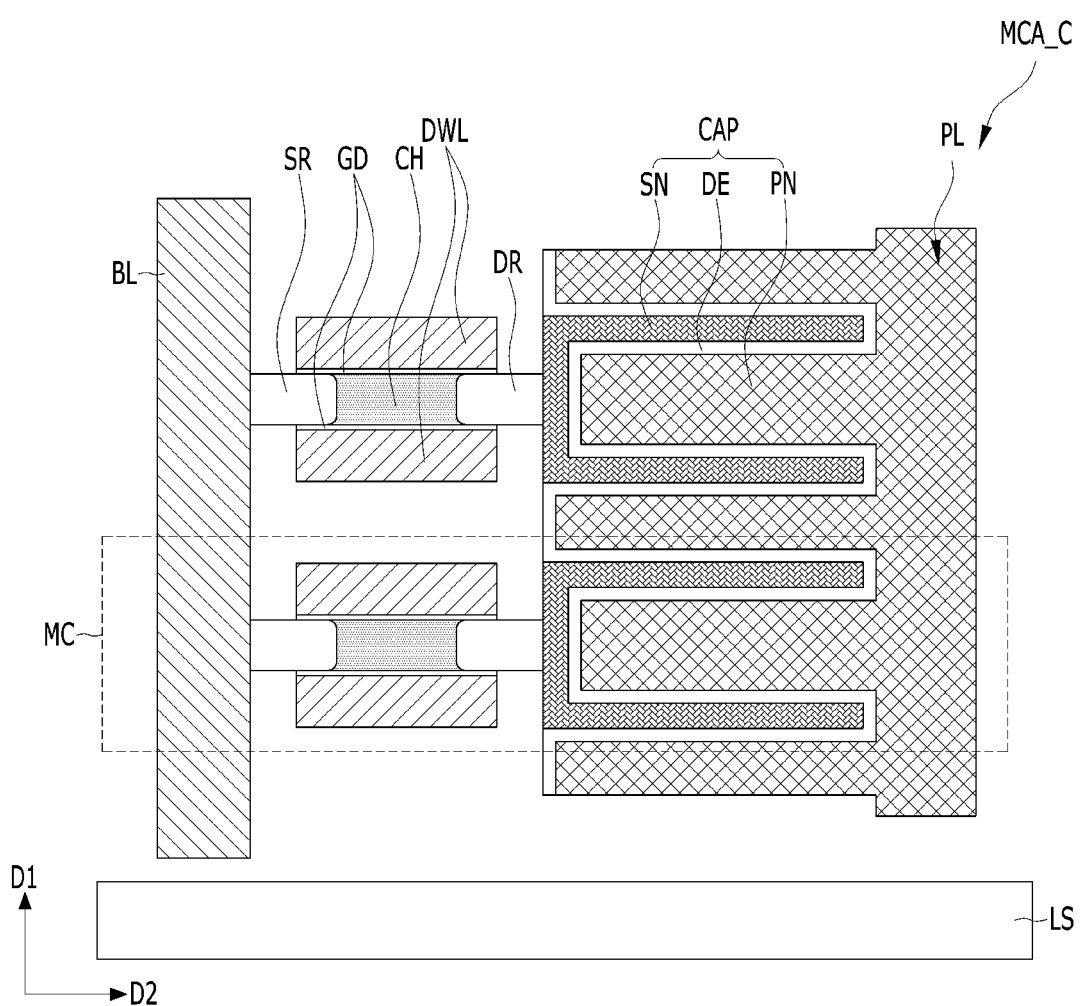
FIG. 4 is a schematic cross-sectional view illustrating a memory cell array of a semiconductor device in accordance with another embodiment of the present invention.

FIG. 3 is a schematic perspective view illustrating a semiconductor device in accordance with an embodiment of the present invention. FIG. 4 is a schematic cross-sectional view illustrating a vertical memory cell array MCA_C shown in FIG. 3.

Referring to FIGS. 3 and 4, the semiconductor device 100 may include a lower structure LS and a memory cell array MCA over the lower structure LS. A plurality of memory cells MC of FIG. 1 may be arranged in the first to third directions D1, D2, and D3 to form the memory cell array MCA shown in FIG. 3. The memory cell array MCA may include a three-dimensional array of memory cells MC, and the three-dimensional memory cell array may include at least one vertical memory cell array MCA_C and at least one lateral memory array MCA_R. The vertical memory cell array MCA_C may refer to an array of memory cells MC that are vertically arranged in the first direction D1. The lateral memory cell array MCA_R may refer to an array of memory cells MC that are arranged laterally in the third direction D3. The vertical memory cell array MCA_C may be referred to as a column array of memory cells MC, and the lateral memory cell array MCA_R may be referred to as a row array of memory cells MC. The bit line BL may be vertically oriented to be coupled to the vertical memory cell array MCA_C, and the double word line DWL may be oriented laterally to be coupled to the lateral memory cell array MCA_R. The bit line BL coupled to the vertical memory cell array MCA_C may be referred to as a common bit line, and the vertical memory cell arrays MCA_C disposed adjacent in the third direction D3 may be coupled to different common bit lines. The double word line DWL coupled to the lateral memory cell array MCA_R may be referred to as a common double word line Common DWL, and the lateral memory cell arrays MCA_R disposed adjacent in the first direction D1 may be coupled to different common double word lines.

The memory cell array MCA may include a plurality of memory cells MC, and each memory cell MC may include a vertically oriented bit line BL, a laterally oriented active layer ACT, a double word line DWL, and a laterally oriented capacitor CAP. For example, FIG. 3 illustrates a three-dimensional DRAM memory cell array including four memory cells MC.

The active layers ACT disposed adjacent to each other in the first direction D1 may contact one bit line BL. The active layers ACT disposed adjacent to each other in the third direction D3 may share one double word line DWL. The capacitors CAP may be coupled to the active layers ACT, respectively, in a one to one correspondence. The capacitors CAP may share one plate line PL. The individual active layers ACT may be thinner than the first and second word lines WL1 and WL2 of the double word line DWL.

In the memory cell array MCA, a plurality of double word lines DWL may be vertically stacked in the first direction D1. Each individual double word line DWL may include a pair of a first word line WL1 and a second word line WL2. Between the first word line WL1 and the second word line WL2, a plurality of active layers ACT may be laterally arranged to be spaced apart from each other in the third direction D3. The channel CH of the active layer ACT may be disposed between the first word line WL1 and the second word line WL2. The double word line DWL may include a line shape portion LWL and a protrusion portion PWL. The protrusion portion PWL may overlap with the active layer ACT. The double word line DWL of FIG. 1 may also include a line shape portion LWL and a protrusion portion PWL. Since the double word line DWL includes the line shape portion LWL and the protrusion portion PWL, it may have a notch-shaped sidewall.

Figure 5:
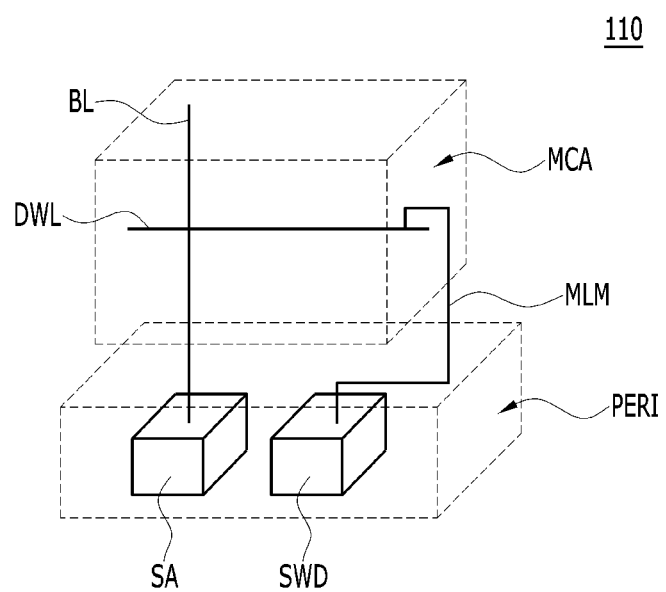
FIGS. 5 and 6 are perspective views illustrating semiconductor devices in accordance with other embodiments of the present invention.
Figure 6:
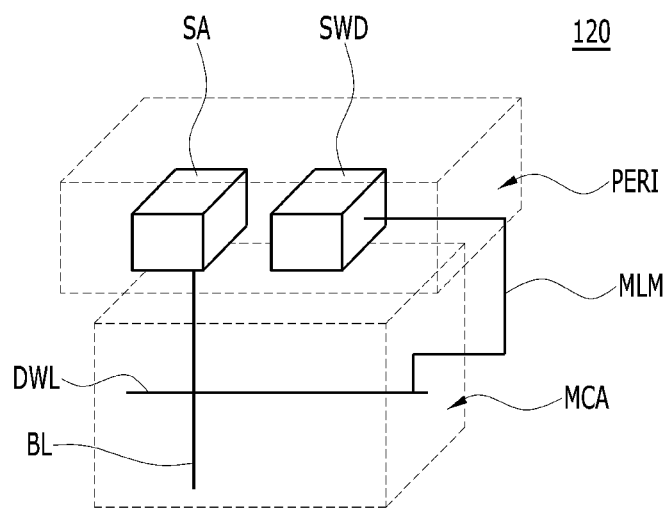

FIGS. 5 and 6 are perspective views illustrating semiconductor devices in accordance with other embodiments of the present invention. FIG. 5 shows a semiconductor device 110 having a COP structure, and FIG. 6 shows a semiconductor device 120 having a POC structure. In FIG. 6, detailed description of the components which also appear in FIG. 5 will be omitted. In FIG. 5, a peripheral circuit portion PERI may correspond to the lower structure LS of FIG. 3.

Referring to FIG. 5, the semiconductor device 110 may include a peripheral circuit portion PERI, and the peripheral circuit portion PERI may be disposed at a lower level than the memory cell array MCA. This may be referred to as a COP (Cell over PERI) structure. The bit line BL of the memory cell array MCA may be vertically oriented in the first direction D1 with respect to the surface of the peripheral circuit portion PERI, and the double word line DWL may be laterally oriented with respect to the surface of the peripheral circuit portion PERI in the third direction D3.

Referring to FIG. 6, the semiconductor device may include a memory cell array MCA and a peripheral circuit portion PERI. The peripheral circuit portion PERI may be disposed at a higher level than the memory cell array MCA. This may be referred to as a POC (PERI over Cell) structure.

In FIGS. 5 and 6, the peripheral circuit portion PERI may include at least one control circuit for driving the memory cell array MCA. At least one control circuit of the peripheral circuit portion PERI may include an N-channel transistor, a P-channel transistor, a CMOS circuit, or a combination thereof. At least one control circuit of the peripheral circuit portion PERI may include an address decoder circuit, a read circuit, a write circuit, and the like. At least one control circuit of the peripheral circuit portion PERI may include a planar channel transistor, a recess channel transistor, a buried gate transistor, a fin channel transistor (FinFET), and the like.

For example, the peripheral circuit portion PERI may include a sub word line driver SWD and a sense amplifier SA. The double word line DWL may be coupled to the sub word line driver SWD through a multi-level metal interconnection (MLM). The bit lines BL may be coupled to the sense amplifier SA.

Figure 7:
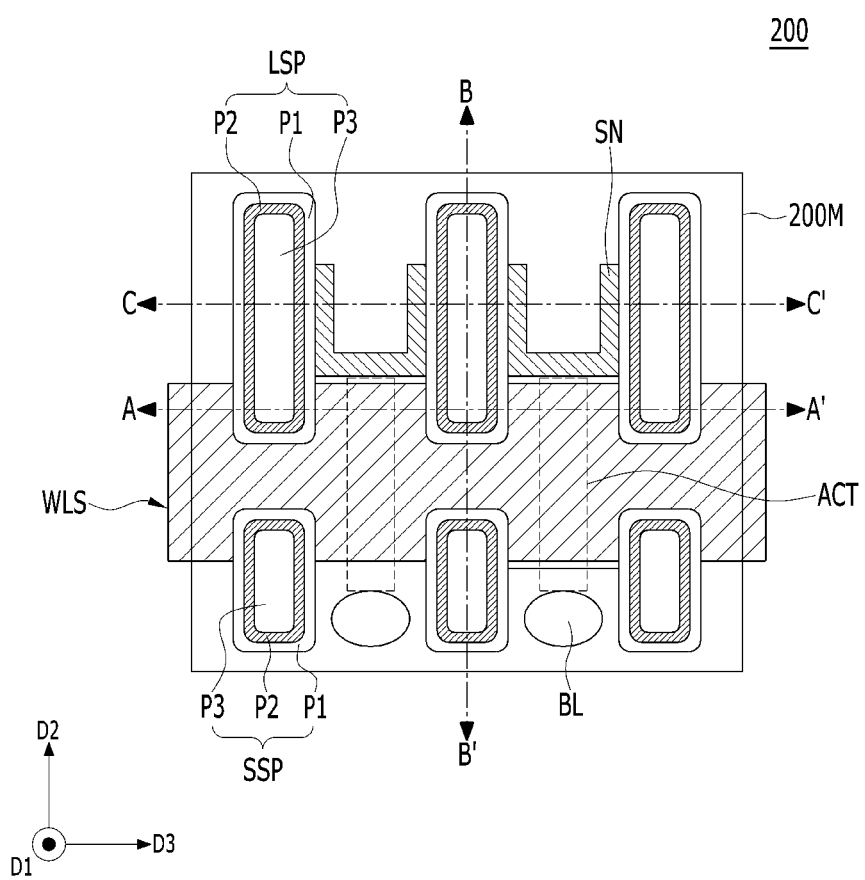
FIG. 7 is a schematic plan view illustrating a semiconductor device in accordance with another embodiment of the present invention.
Figure 8:
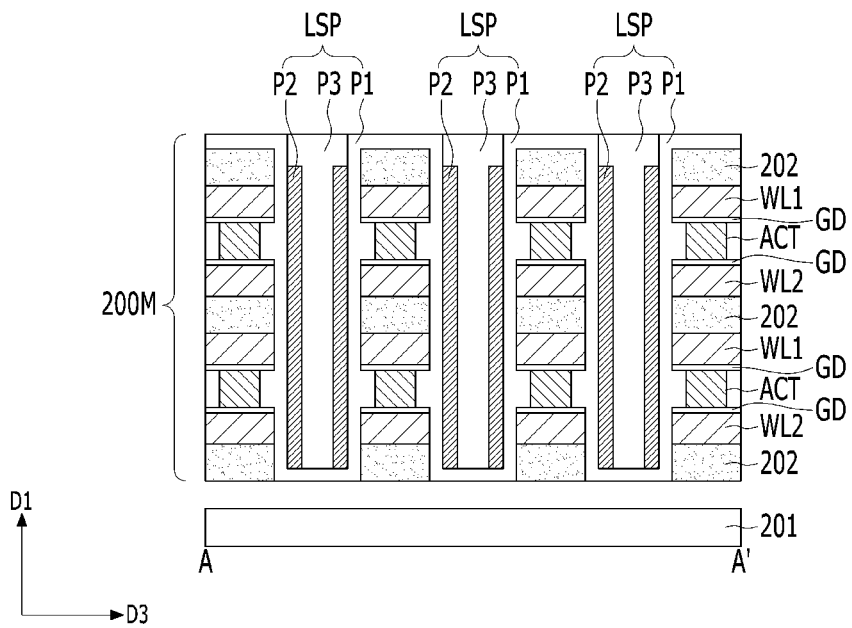
FIG. 8 is a cross-sectional view taken along a line A-A' of FIG. 7.
Figure 9:
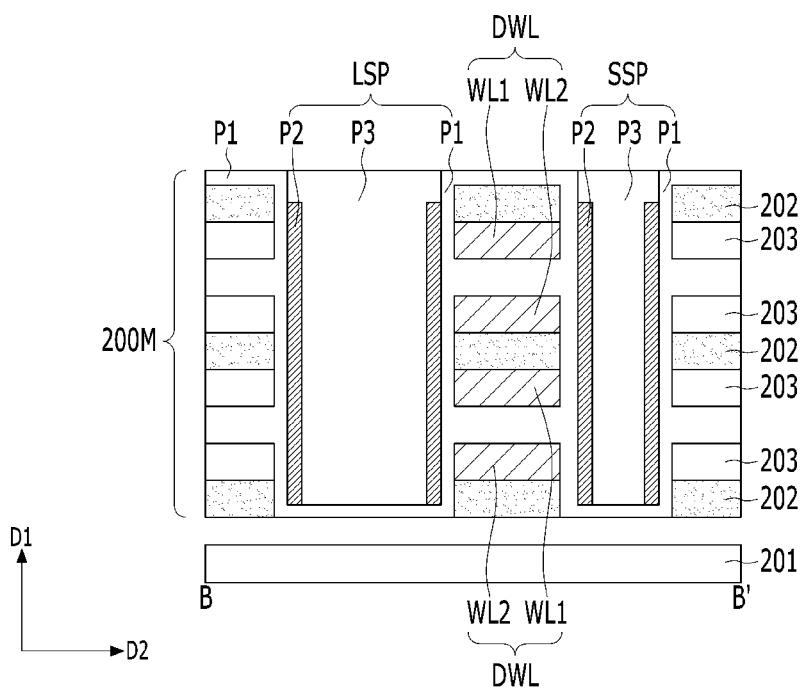
FIG. 9 is a cross-sectional view taken along a line B-B' of FIG. 7.
Figure 10:
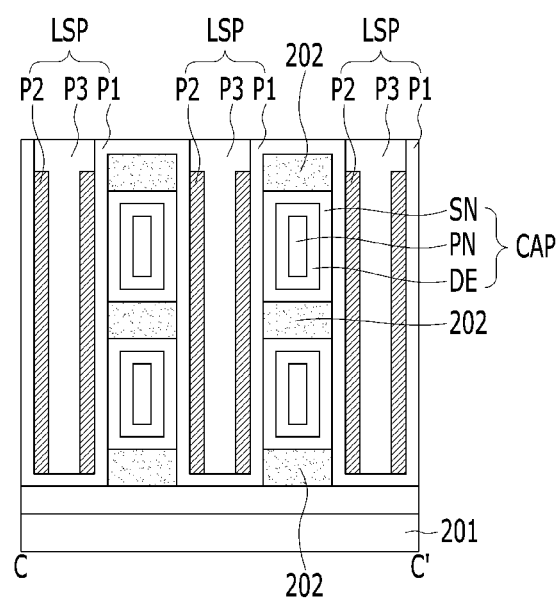
FIG. 10 is a cross-sectional view taken along a line C-C' of FIG. 7.

FIG. 7 is a schematic plan view illustrating a semiconductor device in accordance with another embodiment of the present invention. FIG. 8 is a cross-sectional view taken along a line A-A' of FIG. 7. FIG. 9 is a cross-sectional view taken along a line B-B' of FIG. 7, and FIG. 10 is a cross-sectional view taken along a line C-C' of FIG. 7.

Referring to FIGS. 7 to 10, the semiconductor device 200 may include a stacked structure 200M in an upper portion of a substrate 201, a plurality of large supporters LSP extending vertically to penetrate the stacked structure 200M, and storage nodes SN of a capacitor that are disposed laterally in the third direction D3 between the large supporters LSP. The semiconductor device 200 may further include small supporters SSP. The large supporters LSP and the small supporters SSP may support the stacked structure 200M. The large supporters LSP and the small supporters SSP may be referred to as a vertical isolation layer. The storage nodes SN may be isolated from each other by the large supporters LSP. The bit lines BL may be isolated from each other by the small supporters SSP.

The stacked structure 200M may include a stack of dielectric layers 202, word lines WL1 and WL2, and active layers ACT as shown in FIG. 8. Gate dielectric layers GD may be formed between the word lines WL1 and WL2 and the active layers ACT. As shown in FIG. 9, it may include a stack of the dielectric layers 202 and double word lines DWL. As shown in FIG. 9, it may further include a stack of the dielectric layers 202 and additional dielectric layers 203. It may include a stack of the double word lines DWL. As shown in FIG. 10, it may include a stack of capacitors CAP and the dielectric layers 202. The dielectric layers 202 may include silicon oxide. The additional dielectric layers 203 may include silicon nitride.

The semiconductor device 200 may further include a word line stack WLS which is supported by the large supporters LSP and the small supporters SSP. The word line stack WLS may extend in the third direction D3. The word line stack WLS may be disposed between the large supporters LSP and the small supporters SSP in the second direction D2. The word line stack WLS may refer to a stack of the double word lines DWL, which is described in the above embodiments of the present invention, and the active layer ACT may be disposed between the double word lines DWL. The word line stack WLS may be laterally oriented in the third direction D3 between the large supporters LSP and the small supporters SSP.

The large supporters and the small supporters LSP and SSP may extend in the first direction D1 through the stacked structure 200M. Each of the large supporters LSP and the small supporters SSP may include a stack of a liner layer P1, a blocking spacer P2, and a gap-fill layer P3. The blocking spacer P2 may be disposed between the liner layer P1 and the gap-fill layer P3. The blocking spacer P2 may surround the sidewall of the gap-fill layer P3, and the liner layer P1 may surround the sidewall of the blocking spacer P2. The bottom surface of the blocking spacer P2 may contact the liner layer P1. The top surface of the blocking spacer P2 may be covered by the gap-fill layer P3. The top surface of the blocking spacer P2 may be disposed at a lower level than the top surface of the liner layer P1 and the top surface of the gap-fill layer P3. The liner layer P1 may be disposed between the word lines WL1 and WL2 in the B-B' direction, and the liner layer P1 may extend to be disposed between the additional dielectric layers 203.

The liner layer P1 and the gap-fill layer P3 may include silicon oxide. The blocking spacer P2 may include a material which is different from those of the liner layer P1 and the gap-fill layer P3. The blocking spacer P2 may serve as an etch stopper. The blocking spacer P2 may have an etch selectivity with respect to silicon oxide. The blocking spacer P2 may include a low-k material. For example, the blocking spacer P2 may include a carbon-containing material. The blocking spacer P2 may include silicon carbon oxide (SiCO).

From the perspective of a top view, the large supporters LSP may be larger than the small supporters SSP. The large supporters LSP and the small supporters SSP may be disposed to be spaced apart from each other in the second direction D2.

The storage nodes SN of the capacitor may include a cylindrical-shaped storage node. The blocking spacer P2 may be disposed between the neighboring storage nodes SN in the third direction D3. The storage nodes SN may be stably formed due to the blocking spacer P2.

The bit lines BL may be vertically oriented in the first direction D1 between the small supporters SSP. The small supporters SSP may be disposed between the neighboring bit lines BL. The blocking spacer P2 may be disposed between bit lines BL that are disposed adjacent to each other in the third direction D3.

FIGS. 11 to 16 are cross-sectional views illustrating a method for fabricating a semiconductor device in accordance with another embodiment of the present invention.

Figure 11:
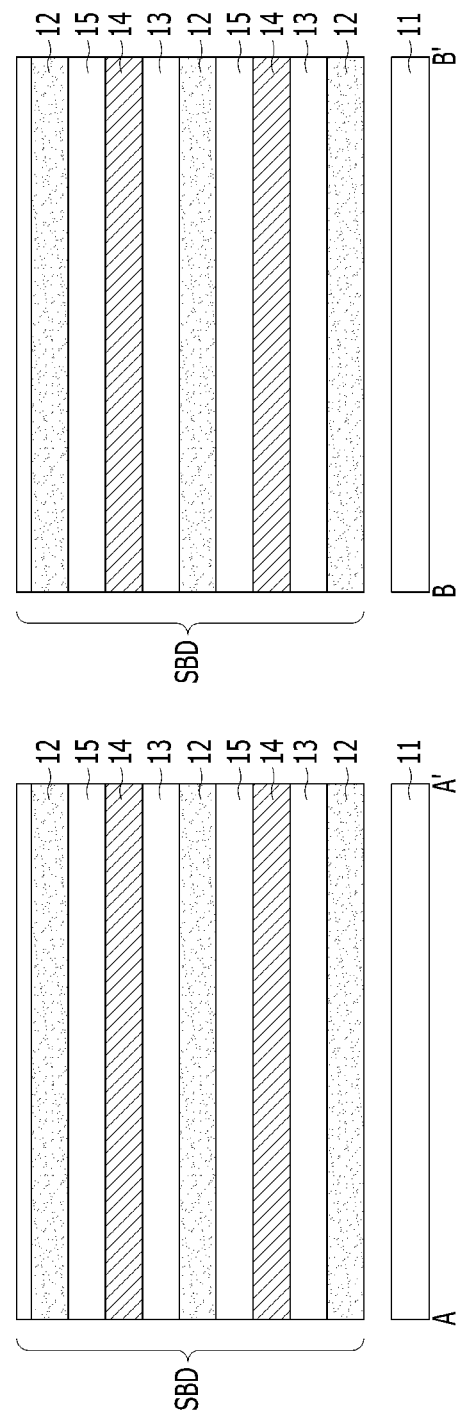
FIGS. 11 to 16 are cross-sectional views illustrating a method for fabricating a semiconductor device in accordance with another embodiment of the present invention.

Referring to FIG. 11, a stack body SBD may be formed by sequentially stacking a first dielectric layer 12, a first sacrificial layer 13, a semiconductor layer 14, and a second sacrificial layer 15 over the substrate 11. The stack body SBD may include a plurality of sub-stacks including the first dielectric layer 12, the first sacrificial layer 13, the semiconductor layer 14, and the second sacrificial layer 15. The first dielectric layer 12 may be silicon oxide, and the first and second sacrificial layers 13 and 15 may be silicon nitride. The semiconductor layer 14 may be polysilicon. According to another embodiment of the present invention, the stacked body SBD may be formed by alternately stacking a silicon layer and a silicon germanium layer.

Figure 12:
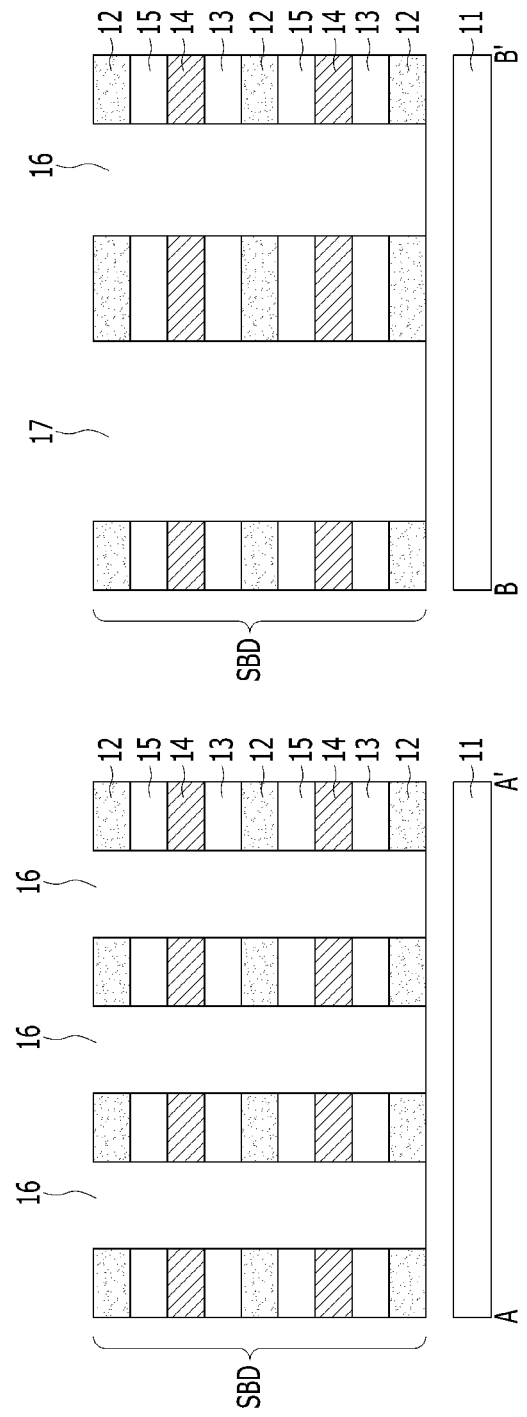

Referring to FIG. 12, small openings 16 and large openings 17 may be formed by etching the stack body SBD.

Figure 13:
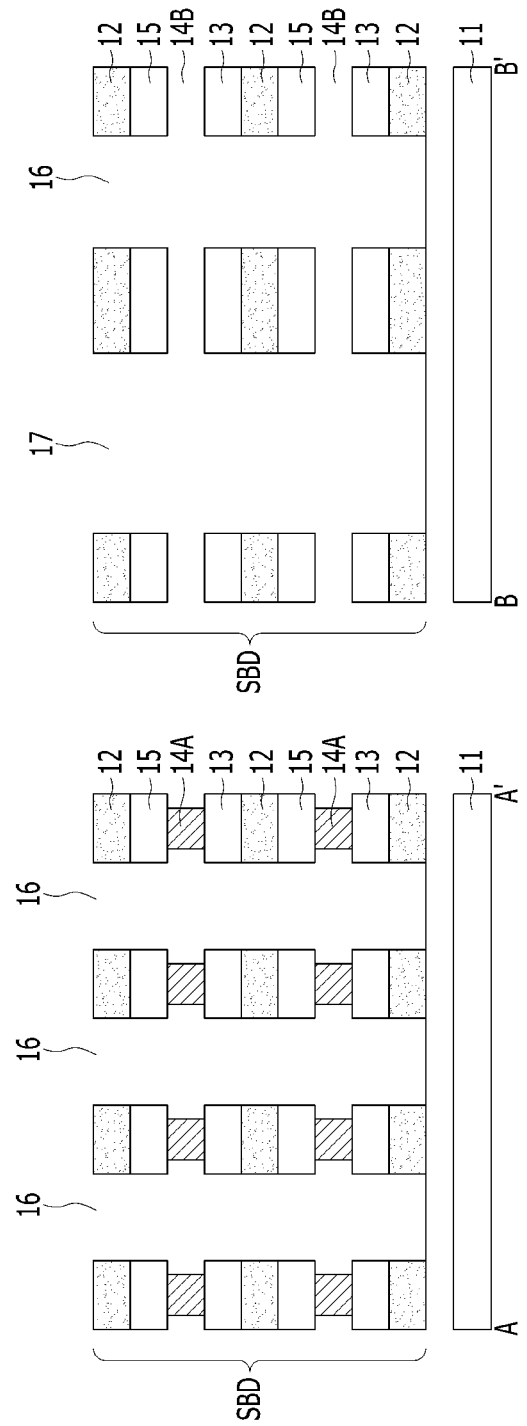

Referring to FIG. 13, the semiconductor layers 14 may be selectively etched to form active layers 14A. In the A-A' direction, the active layer 14A may be disposed between the first sacrificial layer 13 and the second sacrificial layer 15. In the B-B' direction, an air gap 14B may be formed between the first sacrificial layer 13 and the second sacrificial layer 15.

Figure 14:
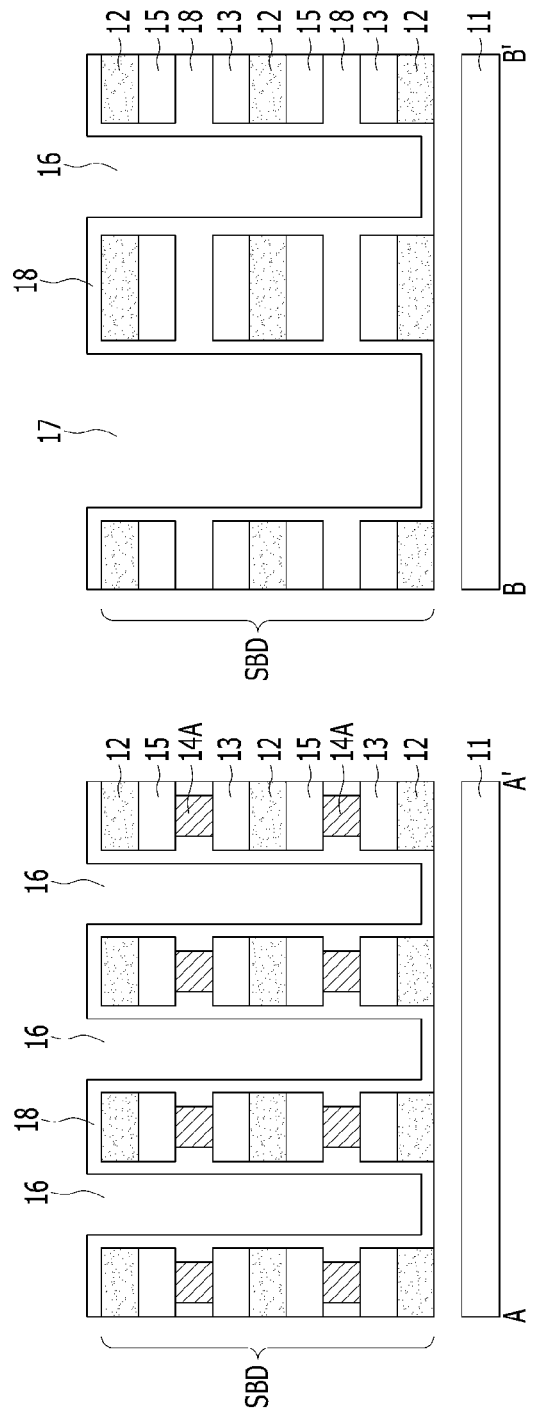

Referring to FIG. 14, a liner layer 18 may be formed over the active layers 14A. The liner layer 18 may include silicon oxide. In the B-B' direction, the liner layer 18 may fill a space between the first sacrificial layer 13 and the second sacrificial layer 15.

Figure 15:
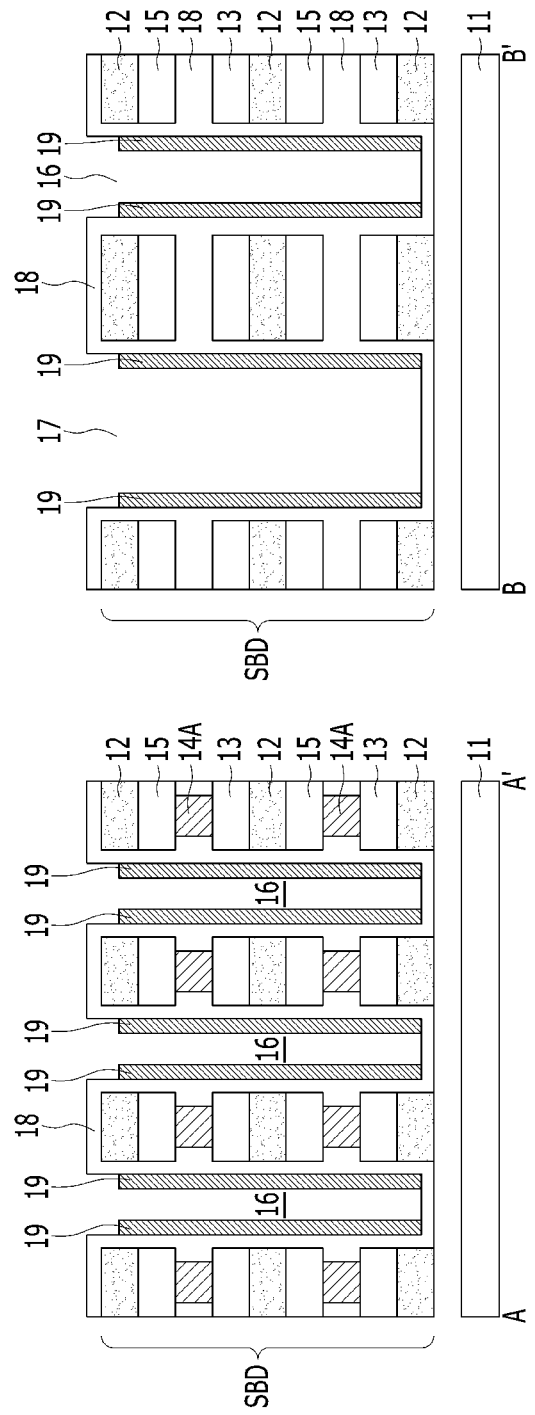

Referring to FIG. 15, the blocking spacers 19 may be formed over the liner layer 18. The blocking spacers 19 may be formed by depositing silicon carbon oxide (SiCO) and performing an etch-back process. The top surface of the blocking spacer 19 may be disposed at a lower level than the top surface of the liner layer 18.

Figure 16:
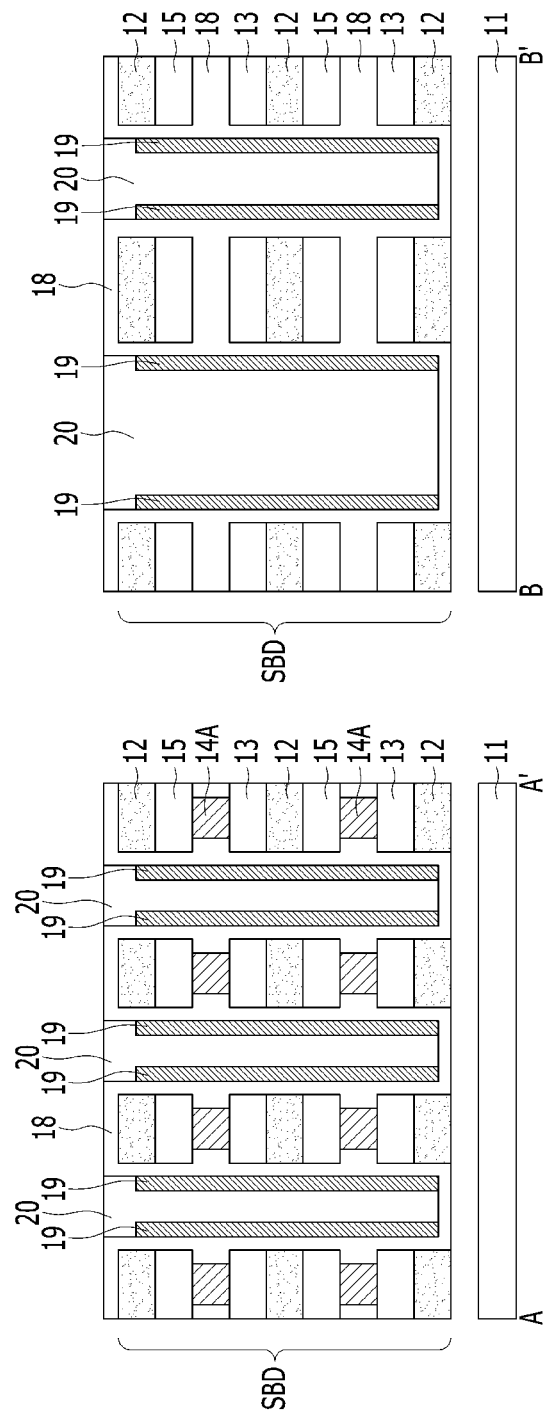

Referring to FIG. 16, a gap-fill layer 20 may be formed over the blocking spacer 19. The gap-fill layer 20 may include silicon oxide. Subsequently, the gap-fill layer 20 may be planarized to expose the top surface of the liner layer 18.

Subsequently, the first and second sacrificial layers 13 and 15 may be replaced with the word lines WL1 and WL2 as shown in FIGS. 7 and 8.

Subsequently, referring to FIGS. 7 to 10, the bit lines BL and the storage nodes SN of the capacitor may be formed.

According to the embodiment of the present invention, since a blocking spacer is formed as a supporter or an isolation layer, a storage node may be stably formed.

Also, according to the embodiment of the present invention, since a blocking spacer is used as a supporter or an isolation layer, capacitance may be secured.

While the present invention has been described with respect to the specific embodiments, it will be apparent to those skilled in the art that various changes and modifications may be made without departing from the spirit and scope of the invention as defined in the following claims.

What is claimed is:

1. A semiconductor device comprising:
   a word line stack over a substrate;
   a plurality of supporters including vertically extending blocking spacers to support the word line stack; and
   storage nodes of a capacitor disposed laterally between the supporters.

2. The semiconductor device of claim 1, wherein each of the supporters further includes a liner layer, and a gap-fill layer over the liner layer, and wherein the blocking spacer is disposed between the liner layer and the gap-fill layer.

3. The semiconductor device of claim 2, wherein the liner layer and the gap-fill layer include silicon oxide, and the blocking spacer includes silicon carbon oxide.

4. The semiconductor device of claim 2, wherein the liner layer is disposed between the blocking spacer and the storage nodes.

5. The semiconductor device of claim 1, wherein the storage nodes of the capacitor include a cylinder-shaped storage node.

6. The semiconductor device of claim 1, wherein the supporters include large supporters and small supporters that are smaller than the large supporters.

7. The semiconductor device of claim 6, further comprising:
   a vertically oriented bit line between the small supporters.

8. The semiconductor device of claim 6, further comprising:
   a laterally oriented word line between the large supporters and the small supporters.

9. A semiconductor device comprising:
   active layers vertically stacked over a substrate;
   word lines extending in a direction crossing the active layers over the active layers;
   a bit line commonly coupled to one side of each of the active layers and extending in a direction perpendicular to the substrate;
   storage nodes of a capacitor that are vertically stacked over the substrate while being coupled to another side of each of the active layers; and
   a plurality of supporters including a vertically extending blocking spacer to support the storage nodes.

10. The semiconductor device of claim 9, wherein each of the supporters further includes a liner layer, and a gap-fill layer over the liner layer, and the blocking spacer is disposed between the liner layer and the gap-fill layer.

11. The semiconductor device of claim 10, wherein the liner layer and the gap-fill layer include silicon oxide, and the blocking spacer includes silicon carbon oxide.

12. The semiconductor device of claim 10, wherein the liner layer is disposed between the blocking spacer and the storage nodes.

13. The semiconductor device of claim 9, wherein the storage nodes of the capacitor include a cylinder-shaped storage node.

14. The semiconductor device of claim 9, wherein the supporters include large supporters and small supporters that are smaller than the large supporters.

15. The semiconductor device of claim 14, wherein the bit line is vertically oriented between the small supporters.

16. The semiconductor device of claim 15, wherein the word lines are laterally oriented between the large supporters and the small supporters.

17. A semiconductor device comprising:
    a plurality of stack structures over a substrate;
    a plurality of vertical isolation layers including vertical blocking spacers to support the stack structures; and
    wherein the vertical blocking spacers are formed of carbon-containing material.

18. The semiconductor device of claim 17, wherein the stack structures comprise a word line stack or a capacitor stack.

19. The semiconductor device of claim 17, wherein the vertical blocking spacers are formed of silicon carbon oxide.

20. The semiconductor device of claim 17, wherein each of the vertical isolation layers further comprising a first silicon oxide layer and a second silicon oxide layer, wherein each of the vertical blocking layers are disposed between the first silicon oxide layer and the second silicon oxide layer.

\* \* \* \* \*